US005773994A

United States Patent [19]
Jones

[11] Patent Number: 5,773,994
[45] Date of Patent: Jun. 30, 1998

[54] METHOD AND APPARATUS FOR IMPLEMENTING AN INTERNAL TRI-STATE BUS WITHIN A PROGRAMMABLE LOGIC CIRCUIT

[75] Inventor: Christopher W. Jones, Pleasanton, Calif.

[73] Assignee: Cypress Semiconductor Corp., San Jose, Calif.

[21] Appl. No.: 573,237

[22] Filed: Dec. 15, 1995

[51] Int. Cl.$^6$ .............................................. H03K 19/177
[52] U.S. Cl. ................................................. 326/41; 326/56
[58] Field of Search .......................... 326/39, 38, 56–58, 326/41.4, 44–45

[56] References Cited

U.S. PATENT DOCUMENTS

| | | | |
|---|---|---|---|
| 4,758,746 | 7/1988 | Birkner | 326/40 |
| 4,789,951 | 12/1988 | Birkner | 326/40 |
| 4,855,954 | 8/1989 | Turner et al. | 326/39 |
| 4,879,481 | 11/1989 | Pathak | 326/40 |
| 4,933,577 | 6/1990 | Wong | 326/40 |
| 5,075,575 | 12/1991 | Shizukuishi | 326/39 |
| 5,122,685 | 6/1992 | Chan et al. | 326/41 |
| 5,208,491 | 5/1993 | Ebeling et al. | 326/39 |
| 5,338,984 | 8/1994 | Sutherland | 326/39 |
| 5,399,922 | 3/1995 | Kiani et al. | 326/40 |
| 5,457,410 | 10/1995 | Ting | 326/41 |
| 5,497,108 | 3/1996 | Menon et al. | 326/86 |
| 5,504,440 | 4/1996 | Sasaki | 326/41 |
| 5,677,638 | 10/1997 | Young et al. | 326/39 |

OTHER PUBLICATIONS

Cypress Semiconductor, Corp. *Programmable Logic Data Book 1996*, "Introduction to Cypress PLDs"; pp. 2–1 to 2–5; Nov., 1995.
Cypress Semiconductor, Corp. *Programmable Logic Data Book 1996*, "PALCE22V10: Flash Erasable, Reprogrammable CMOS PAL® Device"; pp. 2–46 to 2–48; Nov., 1995.
Cypress Semiconductor, Corp. *Programmable Logic Data Book 1996*, "Ultra38000™ Family: Ultra Logic™ Very High Speed CMOS FPGAs"; pp. 4–1 to 4–4; Nov. 1995Cypress Semiconductor, Corp. *Programmable Logic Data Book 1996*, "pASIC380 Family: Ultra Logic™ Very High Speed CMOS FPGAs"; pp. 4–28 to 4–34; Nov. 1995.

(List continued on next page.)

*Primary Examiner*—Edward P. Westin
*Assistant Examiner*—Benjamin D. Driscoll
*Attorney, Agent, or Firm*—Blakely, Sokoloff, Taylor & Zafman LLP

[57] ABSTRACT

An internal tri-state bus is provided in a field programmable gate array (FPGA). The FPGA is comprised of an input/output interface which receives input data and generates output data. User-configurable logic cells are included within the FPGA and are coupled to the input/output interface through interconnect elements. The interconnect elements provide a number of conductive elements which supply input signals to the logic cells and receive output signals generated by the logic cells. At least one of the logic cells contains at least one output and multiple logic elements which typically include AND gates, multiplexers and registers. The logic elements receive input signals from the interconnect elements, perform digital functions on the input signals and generate output signals to the interconnect elements. At least one logic cell in the FPGA contains a tri-state buffer which is coupled to at least one output of the logic cell. In response to an enable signal provided to the tri-state buffer, the tri-state buffer selectively provides one of the output signals to the interconnect elements. The enable signal may be any input signal supplied to a logic cell. Additionally, the enable signal may enable a tri-state buffer to provide an output signal to an interconnect element when the enable signal comprises either a high logic level or a low logic level. In an alternative embodiment an enable signal may be generated by a logic element within the logic cell.

26 Claims, 8 Drawing Sheets

OTHER PUBLICATIONS

"Ultra 38000 Family", *Cypress Semiconductor Corp. Data Sheet*, pp. 1–4 (Oct. 1995) Document #38–00492.

"Ultra 38003", *Cypress Semiconductor Corp. Data Sheet*, p. 1 (Oct. 1995) Document #38–00479.

"Ultra 38005", *Cypress Semiconductor Corp. Data Sheet*, p. 1 (Oct. 1995) Document #38–00481.

"Ultra 38007", *Cypress Semiconductor Corp. Data Sheet*, pp. 1–12 (Oct. 1995) Document #38–00429.

"Ultra 38009", *Cypress Semiconductor Corp. Data Sheet*, p. 1 (Oct. 1995).

"Ultra 380012", *Cypress Semiconductor Corp. Data Sheet*, p. 1 (Oct. 1995) Document #38–00490.

"Ultra 38016", *Cypress Semiconductor Corp. Data Sheet*, p. 1 (Oct. 1995) Document #38–00488.

"Ultra 38020", *Cypress Semiconductor Corp. Data Sheet*, p. 1 (Oct. 1995) Document #38–00486.

*Cypress Semiconductor Corp. Ultra Logic Programmable Logic Data Book*, "pASIC380 Family" pp. 4:1–7 (Oct. 1995) Document #38–00210–B.

*Cypress Semiconductor Corp. Ultra Logic Programmable Logic Data Book*, "CY7C381A,CY7C382A" pp. 4:8–16 (Oct. 1995) Document #38–00253.

*Cypress Semiconductor Corp. Ultra Logic Programmable Logic Data Book*, "CY7C3381A,CY7C3382A" pp. 4:17–24 (Oct. 1995) Document #38–00252.

*Cypress Semiconductor Corp. Ultra Logic Programmable Logic Data Book*, "CY7C383A,CY7C384A" pp. 4:25–33 (Oct. 1995) Document #38–00361.

*Cypress Semiconductor Corp. Ultra Logic Programmable Logic Data Book*, "CY7C385A,CY7C386A", pp. 4:34–44 (Oct. 1995) Document #38–00209–C.

*Cypress Semiconductor Corp. Ultra Logic Programmable Logic Data Book*, "CY7C387A,CY7C388A", pp. 4:45–55 (Oct. 1995) Document #38–00373.

*Cypress Semiconductor Corp. Ultra Logic Programmable Logic Data Book*, "CY7C389A", pp. 4:56 (Oct. 1995).

*Xilinx, Inc. Preliminary Product Description*, "XC5200 Logic Cell Array Family", pp. 1–30 Ver. 3.0 (Oct. 1995).

METHOD AND APPARATUS FOR IMPLEMENTING AN INTERNAL TRI-STATE BUS WITHIN A PROGRAMMABLE LOGIC CIRCUIT

BACKGROUND OF THE INVENTION

1. Field of the Invention

The present invention relates to the field of programmable logic circuits.

2. Art Background

Programmable logic devices provide an attractive alternative to custom designed integrated circuits. The architecture of programmable logic devices significantly reduces the time required to design, layout and fabricate a complex function or state machine in an integrated device. For these reasons, programmable logic devices continue to grow in popularity.

One family of programmable devices comprises field programmable gate arrays (FPGAs). FIG. 1 illustrates a block diagram of a typical FPGA 10. FPGA 10 includes an input/output interface 12 which receives data input to FPGA 10 and provides output data generated by FPGA 10. As generally known in the art, input/output interface 12 may comprise dedicated input cells, input/output cells (I/Os) which may be tri-statable, register elements, and clock inputs. FPGA 10 further comprises a matrix of user-configurable logic cells 14, 16, 18, 20, 22, 24, 26, 28 and 30. Each of the logic cells typically contains a number of logic elements which perform a digital function on signals received by the configurable logic cell. Examples of logic elements contained within each logic cell include AND gates, multiplexers and registers.

Input/output interface 12 communicates with logic cells 14, 16, 18, 20, 22, 24, 26, 28 and 30 via interconnect elements 32, 34, 36, 38, 40, 42, 44 and 46 which typically run vertically and horizontally between the logic cells. The interconnect elements carry input signals received by input/output interface 12 to the appropriate logic cell, enable the outputs of one logic cell to be provided to the inputs of another logic cell and enable the outputs of a logic cell to be provided to input/output interface 12. Each of the interconnect elements comprises a number of interconnect lines which are typically metal lines. The interconnect elements intersect at a number of locations in FPGA 10, such as node 48. At each intersection of interconnect lines a switching element is present. The switching element which may be programmed by a software program to either connect or not connect the interconnect lines intersecting at that point by various techniques known in the art, such as SRAM, anti-fuse, or fuse technologies. The software program thus routes signals within an FPGA from one logic cell to another in order to implement a complex function desired by the user.

An example of a user configurable logic cell, such as provided by Cypress Semiconductor Corporation, is illustrated in FIG. 2. FIG. 2 shows a logic cell 100 which receives 23 input signals from and generates five output signals to an interconnect element such as interconnect element 32 described in FIG. 1. Logic cell 100 contains two six-input AND gates 102 and 112 which receive input signals on inputs 1021–1026 and 1121–1126 respectively. AND gates 102 and 112 generate output signals on outputs 122 and 130 respectively. Logic cell 100 further contains four two-input AND gates 104, 106, 108 and 110 which receive input signals on inputs 1041–1042, 1061–1062, 1081–1082 and 1101–1102 respectively. AND gates 104, 106, 108 and 110 provide inputs to 2-to-1 multiplexers 114 and 116 which are controlled by output 130. The outputs of 2-to-1 multiplexers 114 and 116 are input into 2-to-1 multiplexer 118 which is controlled by output 122. The output of 2-to-1 multiplexer 116 also provides an output signal to output 128. Additionally, the output of 2-to-1 multiplexer 118 provides an output signal to output 124 and an input signal to register 120. Register 120 may comprise a D flip-flop or other memory element as required by the user. Register 120 receives input signals on input 1201 which may operate as a set or preset function, input 1203 which may comprise a reset signal, and input 1202 which clocks the output of multiplexer 118 into register 120 for output on output 126.

Logic cell 100 does not provide a means for generating an internal tri-state output signal from a logic cell. Consequently, conventional logic cell 100 does not provide a means for implementing an internal tri-state bus within an FPGA. However, attempts have been made to provide internal tri-state busses within an FPGA, such as the circuit illustrated in FIG. 3.

The prior art circuit illustrated in FIG. 3 shows four tri-state buffers incorporated into a VersaBlock provided by Xilinx Corporation in the XC5200 family of FPGAs. VersaBlock 200 comprises a configurable logic block 202 which includes four logic cells LC0 210, LC1 208, LC2 206 and LC3 204. The four logic cells are coupled to four tri-state buffers 212, 214, 216 and 218 which are commonly enabled by TS 220. The outputs of the tri-state buffers are coupled to horizontal longlines 222. The four tri-state buffers 212, 214, 216 and 218 are coupled externally to logic cells LC0 210, LC1 208, LC2 206 and LC3 204, and thus require additional routing and programmable interconnect resulting in additional routing delay. Additionally, VersaBlock 200 provides only four tri-state buffers to be shared by four logic cells, which again provides less design flexibility than if a tri-state buffer was provided for each of the multiple outputs provided by a logic cell. VersaBlock 200 also provides only one enable signal TS 220 which commonly enables all four tri-state buffer 212, 214, 216 and 218, and which commonly enables each tri-state buffer with the same polarity signal.

Therefore what is needed is an FPGA which increases design flexibility, can incorporate more complex functions and which lends itself to the creation of more efficient software for interconnecting logic cells to implement complex logic functions. It is therefore desirable to have an FPGA which includes logic cells which have tri-state buffers incorporated within the logic cells. Additionally, it is desirable to have an FPGA which can include a multiple number of tri-state buffers within each logic cell such that each output may contain a tri-state buffer. It is also desirable to have an FPGA which has tri-state buffers incorporated within logic cells, such that each tri-state buffer is separately enabled by a unique enable signal which may be generated by a dedicated input signal to the FPGA, an I/O signal to the FPGA, or any internally generated signal within the FPGA. It is also desirable to have an FPGA which incorporates tri-state buffers into logic cells such that one tri-state buffer may be enabled by an enable signal comprising one polarity or logic level, while another tri-state buffer may be enabled by another enable signal having a different polarity or logic level.

SUMMARY OF THE INVENTION

A novel method and apparatus for implementing an internal tri-state bus within a programmable logic device is disclosed. In one embodiment of the present invention a field programmable gate array (FPGA) incorporating a novel logic cell is described. The FPGA includes an input/output interface to which input data is supplied to the FPGA and from which output data is generated. User-configurable logic cells are included within the FPGA and are coupled to the input/output interface through interconnect elements. The interconnect elements provide a number of conductive elements which supply input signals to the logic cells and receive output signals generated by the logic cells. The interconnect elements additionally route the output signals generated by one logic cell to another logic cell or to the input/output interface of the FPGA. At least one of the logic cells contains, in one embodiment, at least one output and multiple logic elements which typically include AND gates, multiplexers and registers. The logic elements receive input signals from the interconnect elements, perform digital functions on the input signals and generate output signals to the interconnect elements. One of the output signals is coupled to at least one output of the logic cell. Additionally, at least one logic cell in the FPGA contains a tri-state buffer which is coupled to at least one output of the logic cell. In response to an enable signal provided to the tri-state buffer, the tri-state buffer selectively provides one of the output signals to the interconnect elements, thus implementing a novel internal tri-state bus.

The enable signal provided to a tri-state buffer may be any input signal supplied to a logic cell. That is, the enable signal may be generated external to the FPGA and provided to a logic cell through the input/output interface, or the enable signal may be any internal signal generated by, for example, another logic cell and supplied to a logic cell. Additionally, the enable signal may enable a tri-state buffer to provide an output signal to an interconnect element when the enable signal comprises either a high logic level or a low logic level. In an alternative embodiment an enable signal may be generated by a logic element within the logic cell.

The logic cell may alternatively include a number of tri-state buffers coupled to a number of outputs provided by a logic cell. In this embodiment, each of the tri-state buffers is coupled to a separate enable signal which selectively enables each tri-state buffer to provide an output signal generated by the logic elements in a logic cell to an interconnect element. The enable signals may enable the tri-state buffers with different polarity signals or logic levels, such that one enable signal comprising a first polarity or high logic level may selectively enable one tri-state buffer to provide an output signal to an interconnect element, while another enable signal in the same logic cell and comprising a second logic level or a low logic level may selectively enable another tri-state buffer to provide an output signal to another interconnect element.

Other features and advantages of the present invention will be apparent from the accompanying drawings and from the detailed description that follows.

BRIEF DESCRIPTION OF THE DRAWINGS

The features and advantages of the present invention are illustrated by way of example and is by no means intended to limit the scope of the present invention to the particular embodiments shown.

DETAILED DESCRIPTION

A novel method and apparatus for implementing an internal tri-state bus within a programmable logic device is disclosed. In the following description, for purposes of explanation, specific nomenclature is set forth to provide a thorough understanding of the present invention. However, it will be apparent to one skilled in the art that these specific details are not required to practice the present invention. In other instances, well known circuits and devices are shown in block diagram form to avoid obscuring the present invention unnecessarily.

Figure 1:
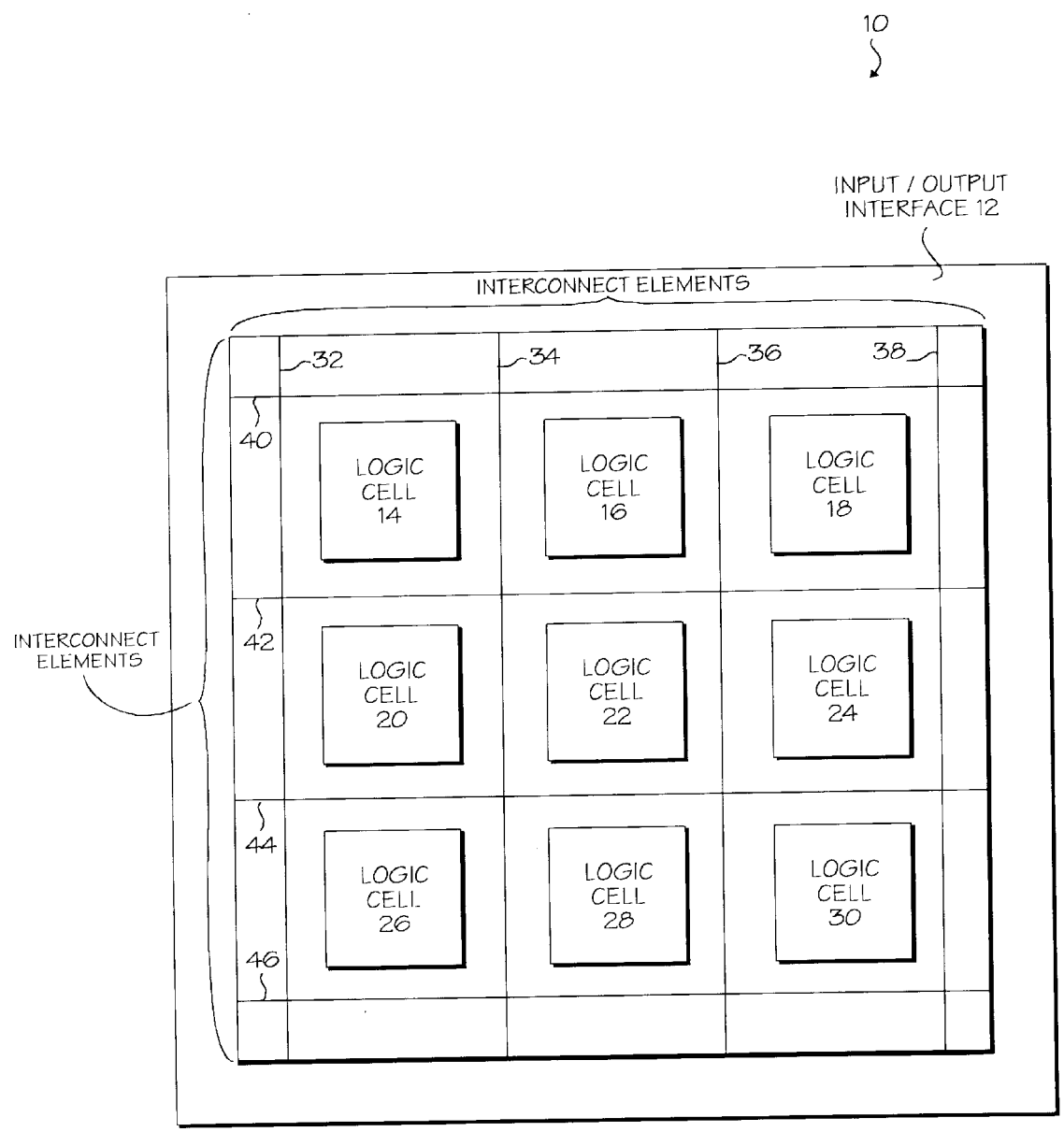
FIG. 1 illustrates a block diagram of a field programmable gate array.
Figure 2:
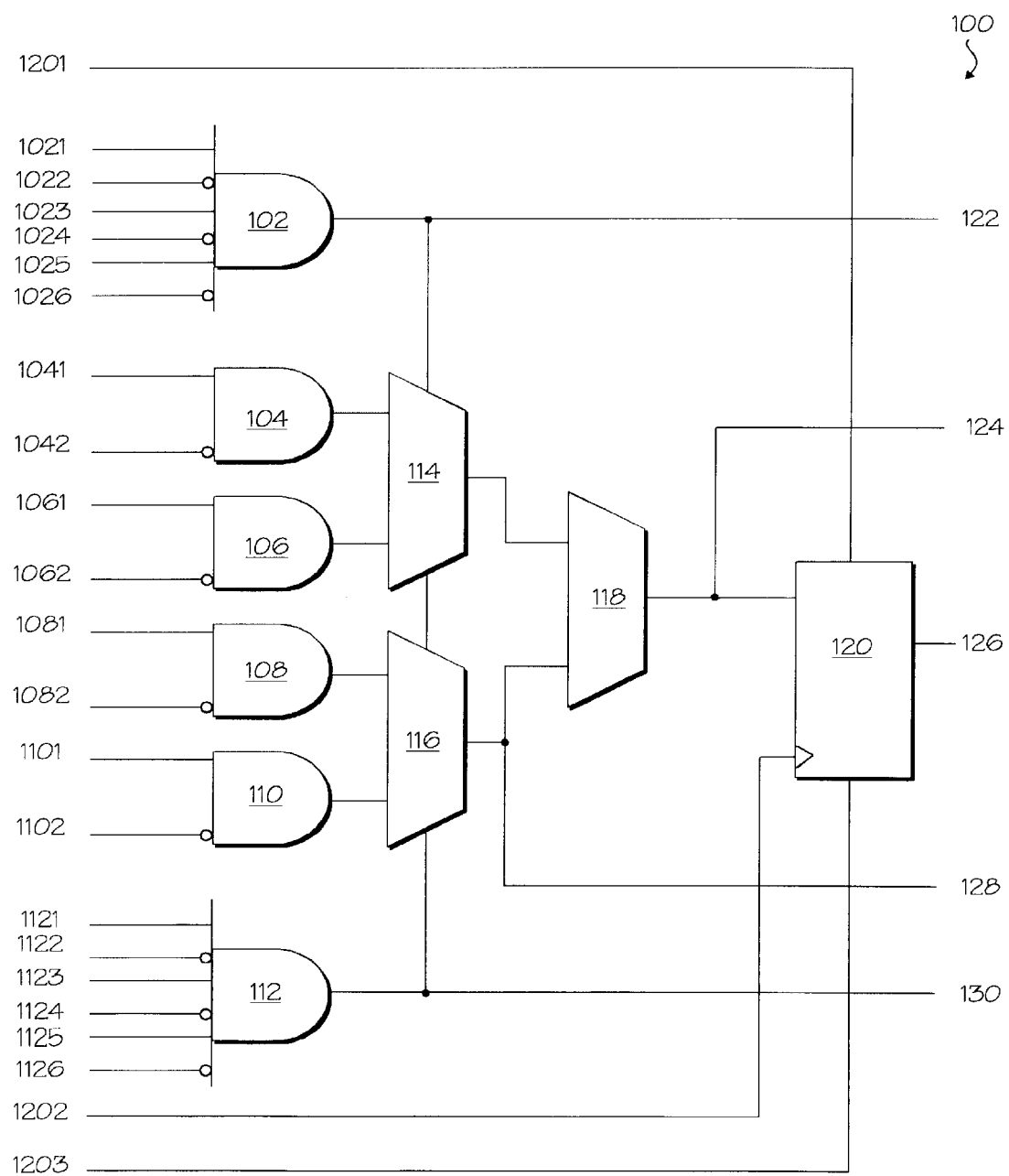
FIG. 2 illustrates a prior art logic cell.
Figure 3:
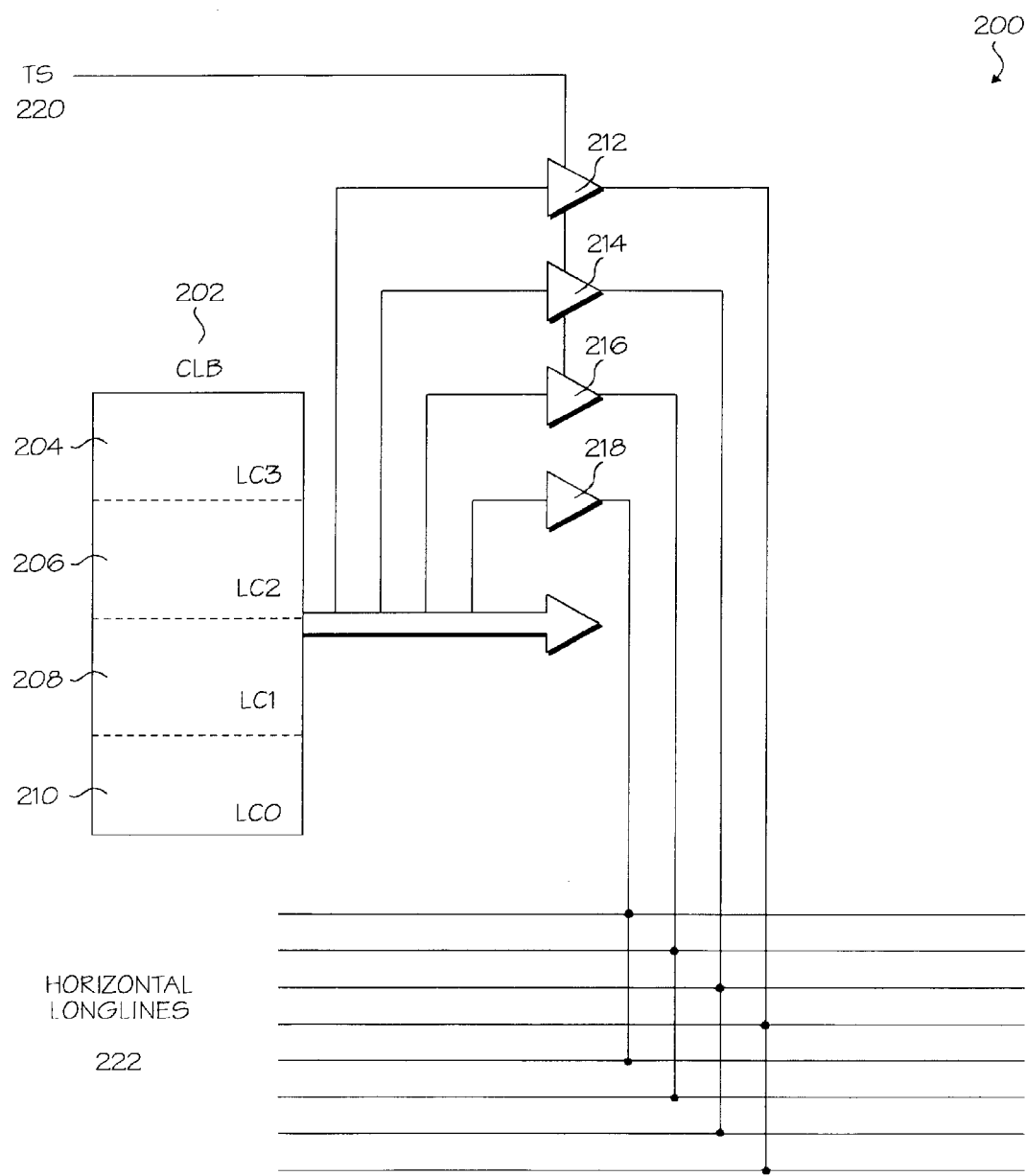
FIG. 3 illustrates a prior art circuit utilizing tri-state buffers external to logic cells and utilizing a common enable line.
Figure 4:
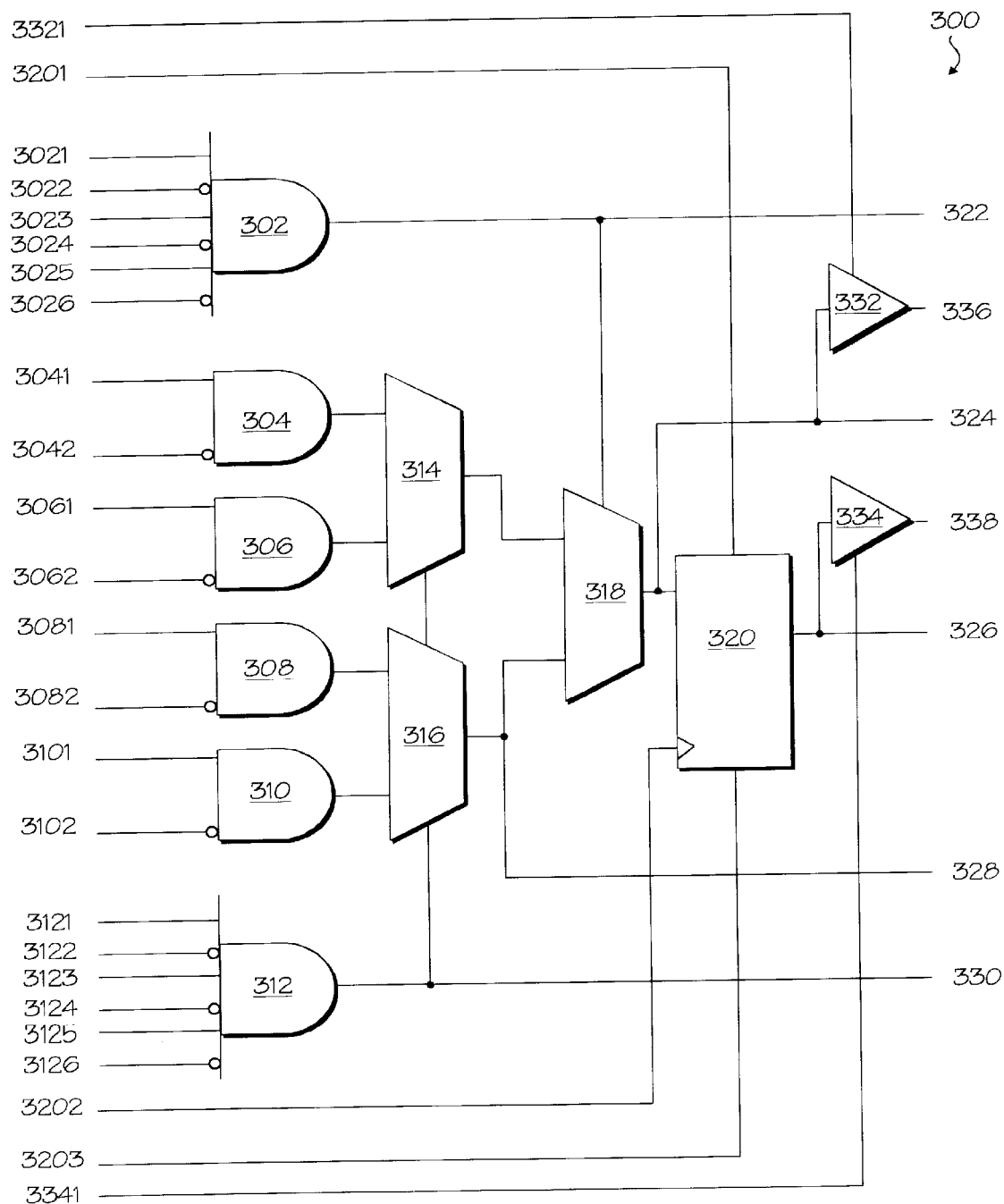
FIG. 4 illustrates a first embodiment of the present invention.

Referring to FIG. 4, one embodiment of the present invention is illustrated. FIG. 4 shows a user-configurable logic cell 300 which may be implemented in an FPGA such as the FPGA architecture illustrated in FIG. 1. Logic cell 300 may be utilized in one of the logic cells 14–30 described in FIG. 1, or logic cell 300 may be utilized in any number of logic cells 14–30 described in FIG. 1. Logic cell 300 has 25 inputs for receiving input signals and seven outputs on which output signals are provided. The number of inputs and outputs are determined by the configuration of the logic elements included within a given logic cell. It will be appreciated by one skilled in the art that a logic cell comprising a different configuration of logic elements and thus having a different number of inputs and outputs is within the scope and spirit of the present invention. The input signals are received from, and the output signals are provided to, a conductive interconnect element such as interconnect element 32 described in FIG. 1.

Logic cell 300 contains two six-input AND gates 302 and 312 which receive input signals on inputs 3021–3026 and 3121–3126 respectively. AND gates 302 and 312 generate output signals on outputs 322 and 330 respectively. Logic cell 300 further contains four two-input AND gates 304, 306, 308 and 310 which receive input signals on inputs 3041–3042, 3061–3062, 3081–3082 and 3101–3102 respectively. AND gates 304, 306, 308 and 310 provide inputs to 2-to-1 multiplexers 314 and 316 which are controlled by a signal on output 330. The outputs of 2-to-1 multiplexers 314 and 316 are input to 2-to-1 multiplexer 318 which is controlled by a signal on output 322. The output of 2-to-1 multiplexer 316 also provides an output signal on output 328. Additionally, the output of 2-to-1 multiplexer 318 provides an output signal on output 324 and an input signal to register 320. Register 320 may comprise a D flip-flop or any other memory element as required by the user. Register 320 receives input signals on input 3201 which may operate as a set or preset function, input 3203 which may comprise a reset signal, and input 3202 which clocks the output of multiplexer 318 into register 320 for output on output 326.

Logic cell 300 further includes two tri-state buffers 332 and 334. The input of tri-state buffer 332 is coupled to output 324, and the output of tri-state buffer 332 is provided as output 336. The input of tri-state buffer 334 is coupled to output 326, and the output of tri-state buffer 334 is provided as output 338. Tri-state buffer 332 receives an enable signal from input 3321 and tri-state buffer 334 receives an enable signal from input 3341.

In operation, input signals are provided to logic cell 300 on inputs 3021–3203 from conductive interconnect elements. These input signals may be generated from an input/output interface or may be received from dedicated input cells or input/output cells, or these input signals may be generated by other logic cells within an FPGA. These input signals are provided to the logic elements 302–320 which perform digital functions upon these signals in order to generate output signals at outputs 322–330. Additionally, the novel logic cell 300 is capable of providing tri-state output signals from tri-state buffers 332 and 334 at outputs 336 and 338 in response to enable signals on inputs 3321 and 3341 respectively. For example, when tri-state buffer 332 receives an enable signal comprising a first polarity or high logic level from input 3321, tri-state buffer 332 provides an output signal from output 328 to output 336. Conversely, when tri-state buffer 332 receives an enable signal comprising a second polarity or low logic level from input 3321, tri-state buffer 332 is disabled such that it does not provide an output signal from output 328 to output 336. Alternatively, tri-state buffer 332 may be enabled by an enable signal comprising a low logic level, and disabled by an enable signal comprising a high logic level.

Tri-state buffers 332 and 334 are illustrated as non-inverting tri-state buffers, however, they may also comprise inverting tri-state buffers, such that when tri-state buffers 332 and 334 receive appropriate polarity enable signals from inputs 3321 and 3341, tri-state buffers 332 and 334 provide output signals to outputs 336 and 338 having the opposite polarity or logical inverse of the output signals at outputs 324 and 326. Additionally, logic cell 300 may comprise only one tri-state buffer coupled to one of outputs 322–330, or logic cell 300 may include a tri-state buffer coupled to each of outputs 322–330 provided by logic elements 302–320.

In the case where there are numerous tri-state buffers, each may be enabled by a separate enable signal provided on separate inputs, or they may coupled in groups with each group collectively utilizing one enable signal. One enable signal may selectively enable one tri-state buffer with a signal having one polarity or logic level, while another enable signal may selectively enable another tri-state buffer with another signal having an opposite polarity of different logic level. For example, tri-state buffer 332 may be enabled by an enable signal having a high logic level, while tri-state buffer 334 may be enabled by an enable signal having a low logic level. As with input signals 3021–3203, the enable signals provided at inputs 3321 and 3341 may be received from dedicated input cells or input/output cells, or these input signals may be generated by other logic cells within an FPGA.

In an alternative embodiment, the outputs 324 and 326 may not be coupled to an interconnect element, such that a total of five outputs would be provided by logic cell 300 to an interconnect element, namely: outputs 322, 328, 330 and outputs 336 and 338 output by tri-state buffers 332 and 334 respectively. This embodiment could be further extended to include one output or all five outputs comprising tri-state buffer outputs only.

Logic cell 300 allows for the implementation of an internal tri-state bus within an FPGA. The internal tri-state bus comprises the conductive interconnect elements and various logic cells such as logic cell 300. Logic cells provide output signals to the interconnect element which subsequently provides these signals to various other logic cells or an input/output interface. A logic cell, such as logic cell 300, may provide an output signal to the internal tri-state bus in response to an enable signal, or may not provide an output signal to the internal tri-state bus when an enable signal tri-states a tri-state buffer within the logic cell (that is, the output of the tri-state buffer is in the high impedance state regardless of and rather than reflecting the state of the input to the buffer). An FPGA utilizing the novel logic cells increases design flexibility for a user, allows an FPGA to implement more complex functions, and allows software routing programs to take advantage of the increased design flexibility to implement complex functions in a more efficient manner.

Figure 5:
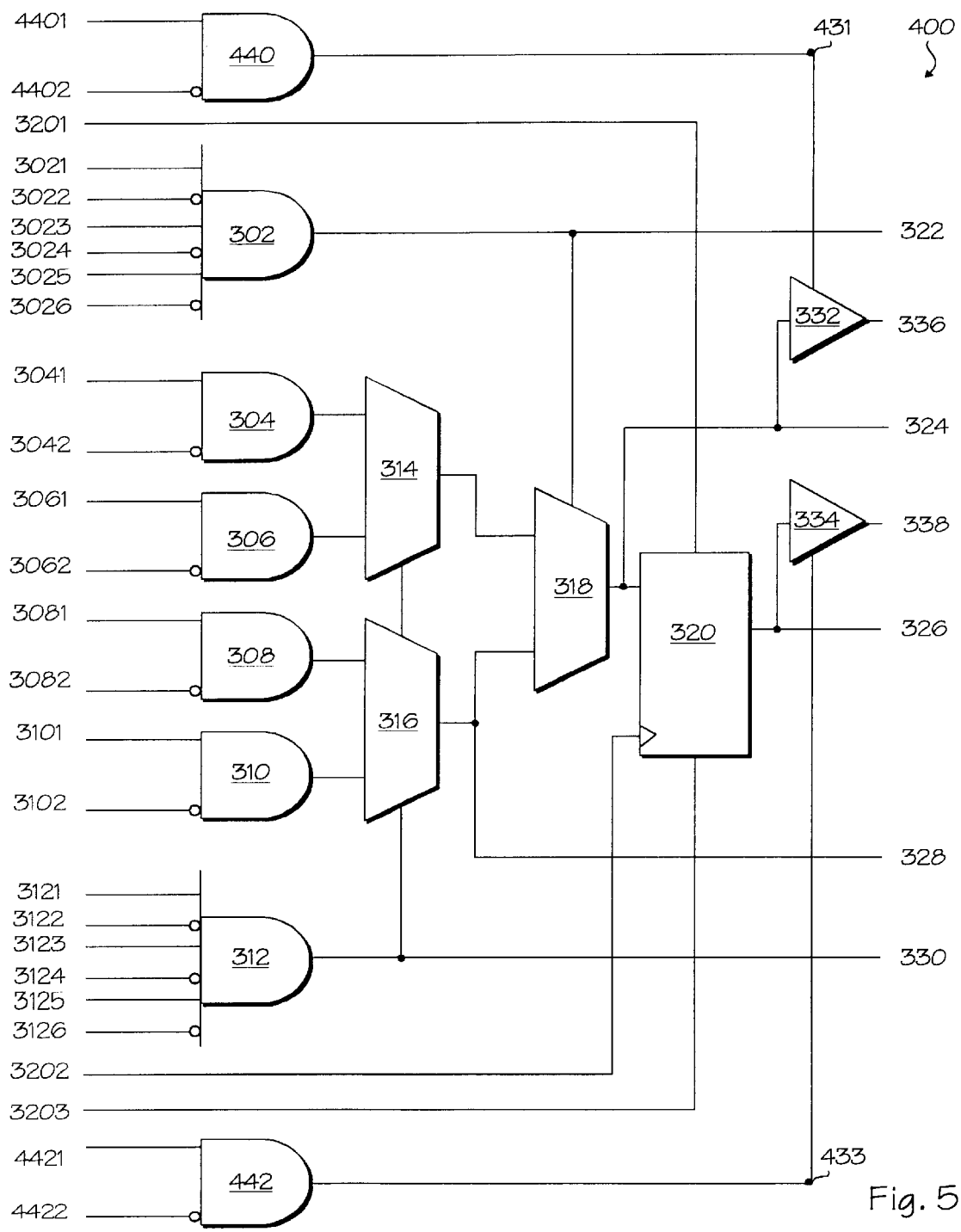
FIG. 5 illustrates a second embodiment of the present invention.

Another degree of design flexibility may be created by providing enable signals to tri-state buffers 332 and 334 from logic elements within a logic cell as illustrated in FIG. 5. FIG. 5 shows a logic cell 400 which operates in a similar manner as logic cell 300 of FIG. 4, however, enable signals are provided to tri-state buffers 332 and 334 at nodes 431 and 433 from two-input AND gates 440 and 442 respectively. AND gate 440 receives input signals on inputs 4401 and 4402, and AND gate 442 receives input signals on inputs 4421 and 4422. In reference to AND gate 440, an enable signal can be provided to tri-state buffer 332 at node 431 in a variety of implementations. For example, an enable signal at node 431 may be the equivalent of an input signal provided to input 4401 by providing a low logic level at input 4402. Alternatively, an enable signal at node 431 may be the logical inverse of an input signal provided to input 4402 by providing a high logic level at node 4401. In other implementations, enable signals generated at nodes 431 and 433 may comprise combinations of input signals received on inputs 4401 and 4402 which are supplied from an input/output interface such as dedicated input cells or input/output cells, or from other logic cells within and FPGA. This provides another degree of design flexibility in generating enable signals for tri-state buffers 332 and 334 within logic cell 400. It will be appreciated that AND gates 440 and 442 are shown by way of example, and other logic elements may also be utilized such as OR gates, wider AND gates, or the like.

Figure 6:
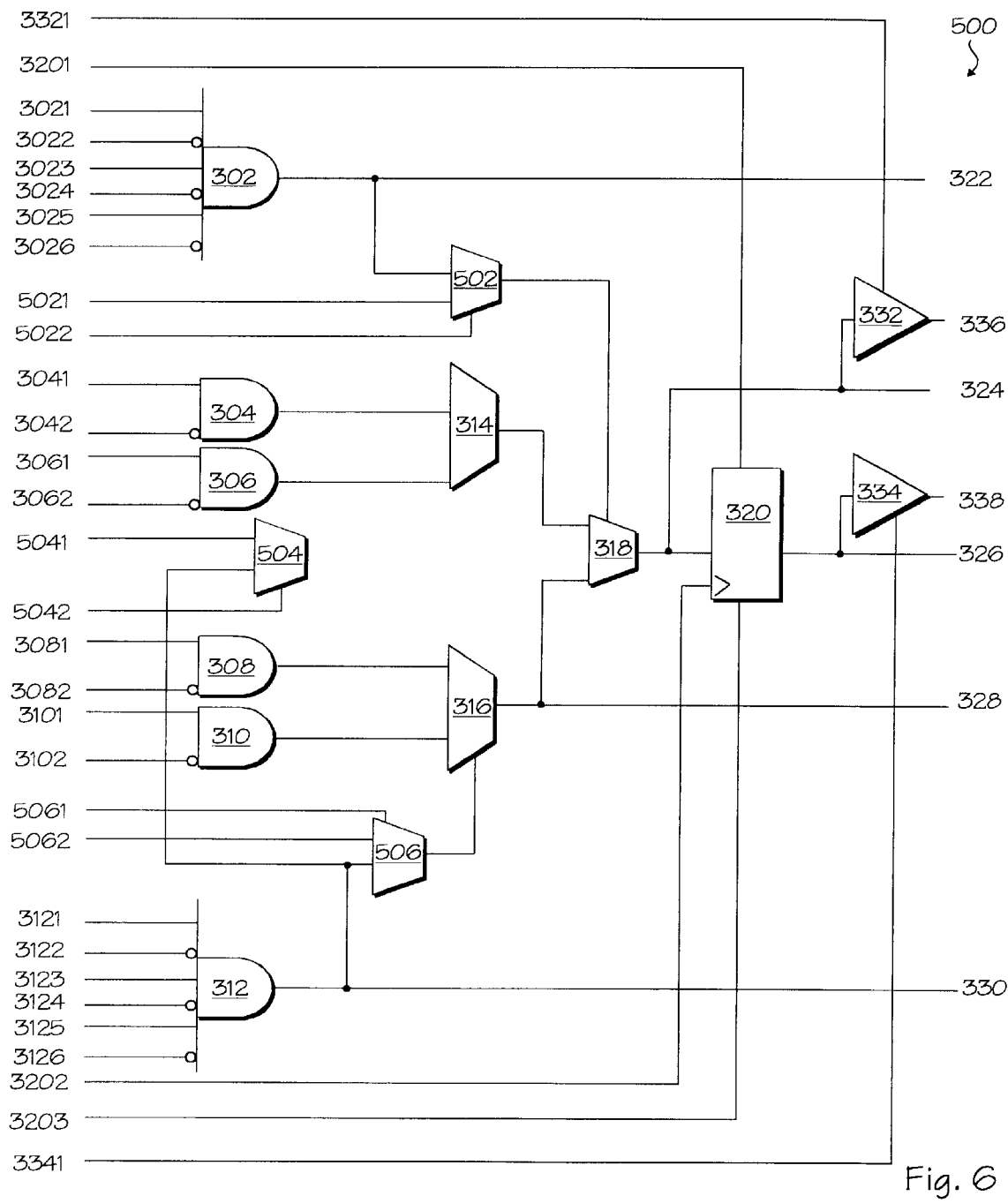
FIG. 6 illustrates a third embodiment of the present invention.

In accordance with the present invention, tri-state buffers may be incorporated into logic cells of varying designs. FIG. 6 illustrates another embodiment of the present invention incorporating tri-state buffers and providing another degree of design flexibility and a means for implementing an internal tri-state bus within an FPGA. FIG. 6 illustrates a logic cell 500 which operates in a similar manner, and comprises similar logic elements as logic cell 400 of FIG. 5, but which includes additional logic elements such as 2-to-1 multiplexers 502, 504 and 506. Multiplexer 502 receives input signals from output 322 and input 5021. Multiplexer 502 is controlled by an input signal received at input 5022, and generates an output signal which controls 2-to-1 multiplexer 318. Multiplexer 504 receives input signals from input 5041 and output 330. Multiplexer 504 is controlled by an input signal received at input 5042, and generates an output signal which controls 2-to-1 multiplexer 314. Multiplexer 506 receives input signals from input 5062 and output 330. Multiplexer 506 is controlled by an input signal received at input 5061, and generates an output signal which controls 2-to-1 multiplexer 316. As in logic cell 400, logic cell 500 further includes tri-state buffers 332 and 334 which are enabled by enable signals received at inputs 3321 and 3341 respectively. Given that logic cell 500 functions in a similar manner as logic cell 400, the features, various alternative embodiments and operation regarding logic cell 400 are hereby incorporated by reference with regards to logic cell 500.

Figure 7:
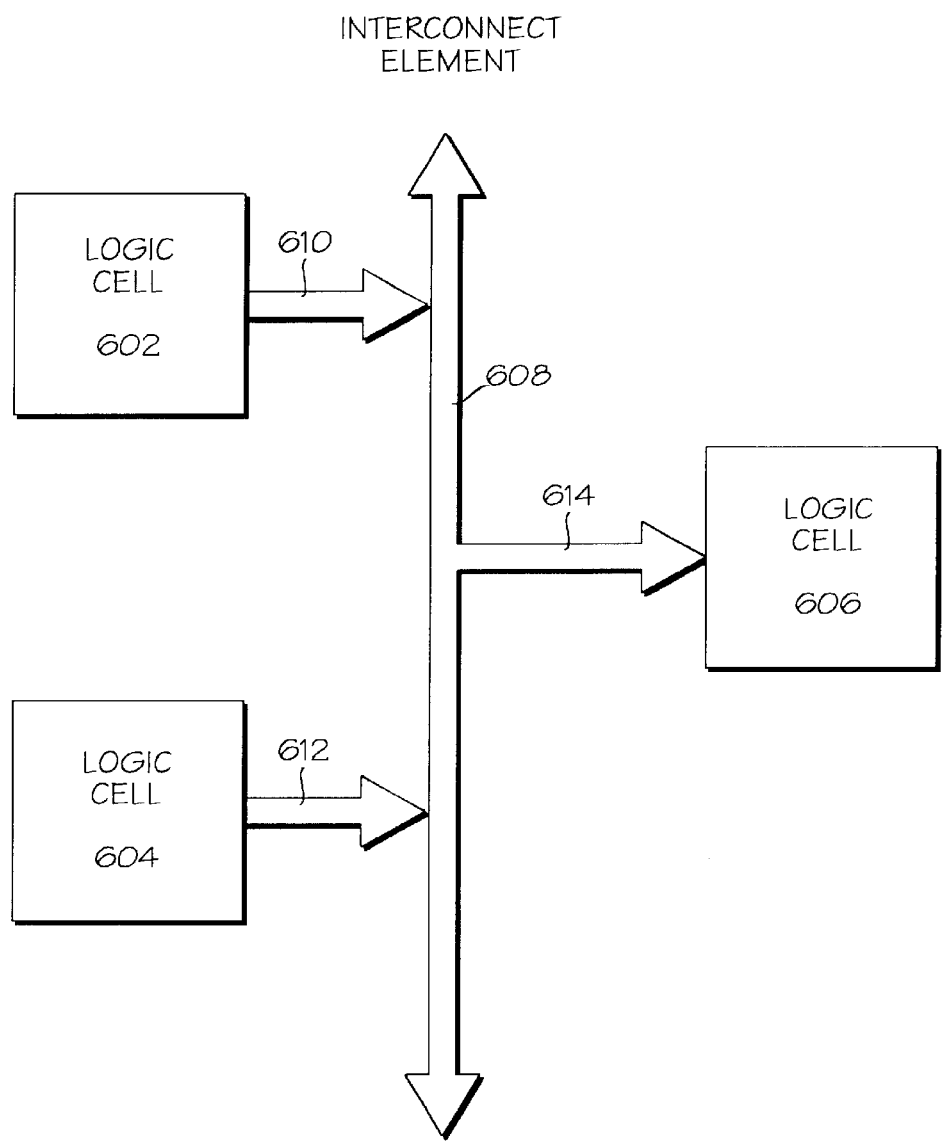
FIG. 7 illustrates a fourth embodiment of the present invention.

As previously discussed, the present invention provides a means for implementing an internal tri-state bus within an FPGA. FIG. 7 shows in block diagram form one embodiment of the present invention further illustrating an internal tri-state bus formed by the present invention. FIG. 7 shows logic cells 602 and 604 providing output signals 610 and 612 (which include tri-state output signals) to a conductive interconnect element 608. Logic cell 606 receives the signals provided to conductive interconnect element 608 as input signals 614. Each of the logic cells 602, 604 and 606 may comprise logic cells 300, 400, 500, 700 or any other logic cell incorporating tri-state buffers in accordance with the spirit and scope of the present described invention. As discussed previously with regards to logic cells 300, 400, 500 and 700, a tri-state buffer or multiple tri-state buffers are included within logic cells 602 and 604, and enable logic cell 602 or 604 to provide an output signal through a tri-state buffer to interconnect element 608 in response to an enable signal. Additionally, logic cell 602 or 604 may not provide an output signal to interconnect element 608 because an enable signal in either of logic cells 602 or 604 has disabled or tri-stated an associated tri-state buffer in either logic cell 602 or 604. Therefore, a tri-state bus is implemented. This adds a greater degree of design flexibility to an FPGA and enables the programming and routing software to be more efficient This architecture can be used to selectively couple, for example, register banks to interconnect element 608, or for other similar applications.

Figure 8:
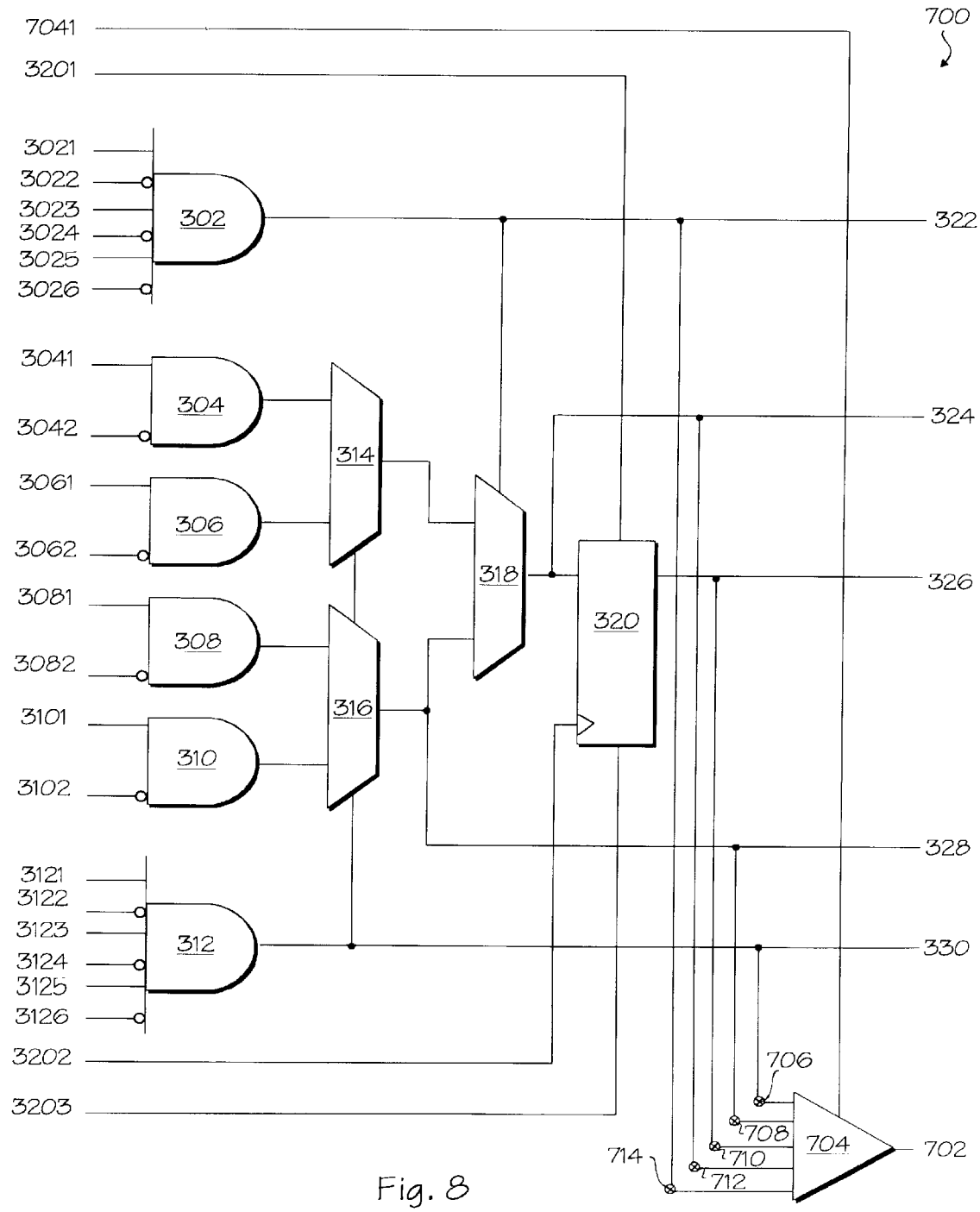
FIG. 8 illustrates a fifth embodiment of the present invention.

Referring now to FIG. 8, another embodiment of the present invention is described. FIG. 8 illustrates a logic cell 700 which functions in a similar manner as logic cell 300 described in FIG. 4. As in logic cell 300, logic cell 700 includes logic elements 302–320 which receive input signals at inputs 3021–3203 and which provide output signals at outputs 322–330. Additionally, logic cell 700 contains a tri-state buffer 704 which may be coupled to one of outputs 322–330 through programmable elements 706, 708, 710, 712 and 714. These programmable elements may comprise programmable elements known in the art, such as SRAM, anti-fuse, or fuse technologies. For example, tri-state buffer 704 may be coupled to receive an output signal from output 322 by programming programmable element 714 to connect output 322 to tri-state buffer 704, and programming elements 706, 708, 710 and 712 not to connect outputs 324, 326, 328 and 330 to tri-state buffer 704. Tri-state buffer 704 provides an output signal to an interconnect element, such as interconnect element 32 described in FIG. 1, when tri-state buffer 704 is selectively enabled by an enable signal provided on input 7041. Tri-state buffer 704 may comprise a non-inverting or inverting tri-state buffer and may be enabled by an enable signal from input 7041 comprising either a high or low logic level. Additionally, logic cell 700 may include multiple tri-state buffers such as tri-state buffer 704, which are coupled to various groups of outputs 322–330 through programmable elements such as programmable elements 706–714. Logic cell 700 also may not provide outputs 322–330 to an interconnect element, but may provide one or all of the outputs directly from tri-state buffer 704 or from multiple tri-state buffers such as tri-state buffer 704.

Although the present invention has been described in terms of specific embodiments, it will be appreciated that various modifications and alterations might be made by those skilled in the art without departing from the spirit and scope of the invention. The invention should therefore be measured in terms of the claims which follow.

What is claimed is:

1. A programmable circuit comprising:
   an input/output interface for receiving data input to said programmable circuit and for generating output data from said programmable circuit;
   a plurality of interconnect elements coupled to said input/output interface; and
   a plurality of logic cells coupled to said plurality of interconnect elements, at least one of said plurality of logic cells comprising:
   a plurality of logic elements for performing digital functions on a plurality of input signals received by said logic cell from said plurality of interconnect elements and for generating a plurality of output signals, said plurality of logic elements comprising:
      a plurality of AND gates for receiving signals from said plurality of interconnect elements, said plurality of AND gates generating a first subset of said plurality of output signals;
      a plurality of first stage multiplexers coupled to said plurality of AND gates, said plurality of first stage multiplexers outputting a second subset of said plurality of output signals;
      at least one second stage multiplexer coupled to said plurality of first stage multiplexers, said at least one second stage multiplexer outputting a third subset of said plurality of output signals; and
      a register element coupled to said at least one second stage multiplexer and said interconnect elements, said register element outputting a fourth subset of said plurality of output signals;
   a first tri-state buffer coupled to said third subset of said plurality of output signals and outputting a fifth subset of said plurality of output signals; and
   a second tri-state buffer coupled to said fourth subset of said plurality of output signals and outputting a sixth subset of said plurality of output signals.

2. The programmable circuit of claim 1, wherein said first and second tri-state buffers selectively output said fifth and sixth subsets of said plurality of output signals in response to a plurality of enable signals.

3. The programmable circuit of claim 2, wherein each of said plurality of enable signals is coupled to one of said first or second tri-state buffers.

4. The programmable circuit of claim 2, wherein:
   one of said plurality of enable signals enables said to selectively output said fifth subset of said plurality of output signals when said one of said plurality of enable signals comprises a high logic level; and
   another one of said plurality of enable signals enables said to selectively output sixth subset of said plurality of output signals when said another one of said plurality of enable signals comprises a low logic level.

5. The programmable circuit of claim 2, wherein one of said plurality of enable signals is any signal generated within said field programmable gate array.

6. The programmable circuit of claim 2, wherein one of said plurality of enable signal is any signal generated external to said programmable circuit.

7. The programmable circuit of claim 2, wherein one of said plurality of enable signals is generated by said plurality of logic elements within said logic cell.

8. The programmable circuit of claim 7, wherein said one of said plurality of enable signals is generated by an independent AND gate separate from said plurality of AND gates.

9. A logic cell receiving input signals and generating output signals, comprising:
   a plurality of logic elements for performing digital functions on said input signals and for generating said output signals, said plurality of logic elements comprising:
      a plurality of AND gates receiving said input signals to said logic cell, said plurality of AND gates generating a first subset of said output signals;
      a plurality of first stage multiplexers coupled to said plurality of AND gates, said plurality of first stage multiplexers outputting a second subset of said output signals;

at least one second stage multiplexer coupled to said plurality of first stage multiplexers, said at least one second stage multiplexer outputting a third subset of said output signals; and a register element coupled to said at least one second stage multiplexer and said input signals, said register element outputting a fourth subset of said output signals;

a first tri-state buffer coupled to said third subset of said output signals and outputting a fifth subset of said output signals; and a second tri-state buffer coupled to said fourth subset of said output signals and outputting a sixth subset of said output signals.

10. The logic cell of claim 9, wherein said first and second tri-state buffers selectively output said fifth and sixth output signals from said logic cell in response to a plurality of enable signals.

11. The logic cell of claim 10, wherein each of said plurality of enable signals is coupled to one of said first or second tri-state buffers.

12. The logic cell of claim 10, wherein:

one of said plurality of enable signals enables said first tri-state buffer to selectively output said fifth subset of signals when said one of said plurality of enable signals comprises a high logic level; and another one of said plurality of enable signals enables said second tri-state buffer to selectively output said sixth subset of signals when said another one of said plurality of enable signals comprises a low logic level.

13. The logic cell of claim 10, wherein one of said plurality of enable signals is any signal generated within a programmable circuit comprising said logic cell.

14. The logic cell of claim 10, wherein one of said plurality of enable signals is any signal generated external to a programmable circuit comprising said logic cell.

15. The logic cell of claim 10, wherein one of said plurality of enable signals is generated by said plurality of logic elements within said logic cell.

16. The logic cell of claim 15, wherein said one of said plurality of enable signals is generated by an independent AND gate separate form said plurality of AND gates.

17. An internal tri-state bus comprising:

a plurality of conductive elements carrying a plurality of signals; and a plurality of logic cells, at least one of said plurality of logic cells comprising a plurality of logic elements coupled to a first tri-state buffer and a second tri-state buffer, said plurality of logic elements generating said plurality of signals, said first and second tri-state buffers coupled to said plurality of conductive elements, wherein said plurality of logic elements comprise:

a plurality of AND gates receiving input signals, said plurality of AND gates generating a first subset of said signals;

a plurality of first stage multiplexers coupled to said plurality of AND gates, said plurality of first stage multiplexers outputting a second subset of said signals;

at least one second stage multiplexer coupled to said plurality of first stage multiplexers, said at least one second stage multiplexer generating a third subset of said signals; and a register element coupled to said at least one second stage multiplexer, said register element outputting a fourth subset of said signals, and wherein said tri-state buffer may be coupled to said first subset, said second subset, said third subset, or said fourth subset of said signals, and wherein said first tri-state buffer is coupled to said third subset of said signals and outputs a fifth subset of said signals to said plurality of conductive elements, and said second tri-state buffer coupled to said fourth subset of said signals and outputs a sixth subset of said signals to said plurality of conductive elements.

18. The internal tri-state bus of claim 17, wherein said first and second tri-state buffers selectively output said fifth and sixth plurality of signals in response to a plurality of enable signals.

19. The internal tri-state bus of claim 18, wherein each of said plurality of enable signals is coupled to one of said first or second tri-state buffers.

20. The internal tri-state bus of claim 18, wherein:

one of said plurality of enable signals enables said first tri-state buffer to selectively output said fifth subset of said signals when said one-of said plurality of enable signals comprises a high logic level; and another one of said plurality of enable signals enables said second tri-state buffer to selectively output said sixth subset of said signals when said another one of said plurality of enable signals comprises a low logic level.

21. The internal tri-state bus of claim 18, wherein one of said plurality of enable signals is any signal generated within a programmable circuit comprising said internal tri-state bus.

22. The internal tri-state bus of claim 18, wherein one of said plurality of enable signals is any signal generated external to a programmable circuit comprising said internal tri-state bus.

23. The internal tri-state bus of claim 18, wherein one of said plurality of enable signals is generated by one of said plurality of logic elements.

24. The internal tri-state bus of claim 23, wherein said one of said plurality of enable signals is generated by an independent AND gate separate from said plurality of AND gates.

25. In a field programmable gate array, a logic cell receiving input signals and generating output signals, comprising:

a plurality of logic elements for performing digital functions on said input signals and generating said output signals;

a programmable element coupled to one of said output signals; and a tri-state buffer having an input coupled to the programmable element and selectively outputting one of said output signals from said tri-state buffer in response to an enable signal.

26. The logic cell of claim 25, further comprising:

a plurality of programmable elements each coupled to a corresponding output signal; and the tri-state buffer includes a plurality of inputs each coupled to a corresponding programmable element such that one of said output signals is selectively output from said tri-state buffer in response to said enable signal.

* * * * *